United States Patent
Kim et al.

(10) Patent No.: US 9,741,904 B2
(45) Date of Patent: Aug. 22, 2017

(54) LIGHT EMITTING DEVICE

(71) Applicant: Samsung Display Co., LTD., Yongin-si, Gyeonggi-Do (KR)

(72) Inventors: Youngchun Kim, Hwaseong-si (KR); Myeong-ju Shin, Seoul (KR); Seokhyun Nam, Seoul (KR); Jaesul An, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/959,630

(22) Filed: Dec. 4, 2015

(65) Prior Publication Data
US 2016/0293803 A1 Oct. 6, 2016

(30) Foreign Application Priority Data
Mar. 30, 2015 (KR) .................. 10-2015-0044368

(51) Int. Cl.
*H01L 33/46* (2010.01)
*H01L 33/50* (2010.01)

(52) U.S. Cl.
CPC .......... *H01L 33/465* (2013.01); *H01L 33/504* (2013.01)

(58) Field of Classification Search
CPC .... H01L 33/105; H01L 33/465; H01L 33/504
See application file for complete search history.

(56) References Cited

U.S. PATENT DOCUMENTS

| 2002/0093287 A1* | 7/2002 | Chen | H01L 33/50 313/512 |
| 2004/0105047 A1* | 6/2004 | Kato | H01L 51/5265 349/69 |
| 2014/0300979 A1* | 10/2014 | Tomida | G02B 5/205 359/839 |

FOREIGN PATENT DOCUMENTS

| JP | 2009049342 A | 3/2009 |
| JP | 2014082058 A | 5/2014 |
| JP | 2014167993 A | 9/2014 |
| KR | 2020090005228 U | 6/2009 |
| KR | 1020110025994 A | 3/2011 |
| KR | 1020130074533 A | 7/2013 |
| KR | 101371971 B1 | 2/2014 |

OTHER PUBLICATIONS

Mitrofanov, et al., High-reflectivity ultraviolet AlGaN/AlGaN distributed Bragg reflectors, Applied Physics Letters, 88, 2006, pp. 171101-1-171101-3.

* cited by examiner

*Primary Examiner* — Tucker J Wright
(74) *Attorney, Agent, or Firm* — Cantor Colburn LLP

(57) ABSTRACT

A light emitting device includes a light emitting chip which generates a first light having a first color, a first cavity layer disposed on the light emitting chip and which generates a second light having a second color and has a first refractive index, a second cavity layer disposed on the first cavity layer and which generates a third light having a third color and has a second refractive index, a first half mirror layer disposed between the first cavity layer and the light emitting chip and which reflects at least a portion of the second light, a second half mirror layer disposed between the first cavity layer and the second cavity layer and which reflects at least a portion of the third light, and a third half mirror layer disposed on the second cavity layer and which transmits the first light.

20 Claims, 10 Drawing Sheets

LIGHT EMITTING DEVICE

This application claims priority to Korean Patent Application No. 10-2015-0044368, filed on Mar. 30, 2015, and all the benefits accruing therefrom under 35 U.S.C. §119, the content of which in its entirety is herein incorporated by reference.

BACKGROUND

1. Field

Exemplary embodiments of the invention relate to a light emitting device, and more particularly, to a light emitting device including a light emitting diode ("LED") chip.

2. Description of the Related Art

A light emitting device, for example, a light emitting diode, which a type of semiconductor devices that transform electrical energy into light, is in the spotlight as an advanced light source capable of replacing a conventional fluorescence lamp or incandescent bulb.

Since the light emitting device generates light using a semiconductor device, the light emitting device consumes relatively lower power than the incandescent bulb that generates light by heating tungsten or the fluorescence lamp that generates light by irradiating a phosphor with ultraviolet rays which are generated by high voltage discharge.

Also, since the light emitting device generates light by using a band gap of the semiconductor device, the light emitting device has a longer lifetime, higher response speed, and environmentally friendly characteristics in comparison to a conventional light source.

Accordingly, a significant amount of research for replacing a conventional light source with a light emitting device has been conducted, and the use of the light emitting device as a light source of indoor and outdoor lighting equipment, such as various lamps, liquid crystal displays, display boards, and street lights, has increased.

SUMMARY

Exemplary embodiments of the invention provide a light emitting device having improved luminous efficiency and color reproducibility.

Embodiments of the invention provide a light emitting device including a light emitting chip which generates a first light having a first color; a first cavity layer disposed on the light emitting chip and having a first refractive index, where the first cavity layer generates a second light having a second color different from the first color; a second cavity layer disposed on the first cavity layer and having a second refractive index different from the first refractive index, where the second cavity layer generates a third light having a third color different from the first color and the second color; a first half mirror layer disposed between the first cavity layer and the light emitting chip, where the first half mirror layer reflects at least a portion of the second light; a second half mirror layer disposed between the first cavity layer and the second cavity layer, where the second half mirror layer reflects at least a portion of the third light; and a third half mirror layer disposed on the second cavity layer and which transmits the first light. In such embodiments, the first cavity layer resonates the second light, and the second cavity layer resonates the third light.

In some embodiments, a product of a thickness of the first cavity layer and the first refractive index may be i times a full width at half maximum of the second light, and a product of a thickness of the second cavity layer and the second refractive index may be j times a full width at half maximum of the third light, where i and j are natural numbers equal to or greater than 1.

In other embodiments, in this case, i and j may be equal to or less than 6.

In still other embodiments, the thickness of the first cavity layer and the thickness of the second cavity layer may be in a range of about 0.1 micrometer (μm) to 1.0 μm.

In even other embodiments, the first cavity layer may include a first base material disposed between the first half mirror layer and the second half mirror layer, and having the first refractive index; and a first phosphor dispersed in the first base material and which generates the second light by absorbing at least a portion of the first light.

In yet other embodiments, the second cavity layer may include a second base material disposed between the second half mirror layer and the third half mirror layer, and having the second refractive index; and a second phosphor dispersed in the second base material and which generates the third light by absorbing at least a portion of the first light and the second light.

In further embodiments, the first phosphor may be a green phosphor, and the second phosphor may be a red phosphor.

In still further embodiments, the first phosphor may be a quantum dot having a smaller size than the second phosphor.

In even further embodiments, each of the first to third half mirror layers may include a plurality of inorganic layers which are alternatingly stacked one on another and have different refractive indices from each other.

In yet further embodiments, the first half mirror layer may include the inorganic layers in which a product of a refractive index and a thickness of each inorganic layer is about ¼ of a wavelength of the second light, and the second half mirror layer may include the inorganic layers in which a product of a refractive index and a thickness of each inorganic layer is about ¼ of a wavelength of the third light.

In much further embodiments, the wavelength of the second light may be in a range of about 480 nanometers (nm) to about 560 nm, and the wavelength of the third light may be in a range of about 640 nm to about 780 nm.

In still much further embodiments, a ratio between the refractive indices of the two inorganic layers disposed adjacent to each other among the plurality of inorganic layers may be equal to or less than about 0.7.

In even much further embodiments, the plurality of inorganic layers may include at least one of silicon oxide, titanium oxide, silicon nitride, hafnium oxide, and zirconium oxide.

In yet much further embodiments, a thickness of each of the first to third half mirror layers may be in a range of about 0.6 μm to about 10 μm.

In some embodiments, the light emitting device may further include a body member, in which an inner space is defined, where the light emitting chip is disposed on a surface thereof to expose the light emitting chip; a first lead fixed to the body member and connected to the light emitting chip; and a second lead fixed to the body member, insulated from the first lead, and connected to the light emitting chip, where the first to third half mirror layers and the first and second cavity layers may be disposed in the inner space.

In other embodiments of the invention, a light emitting device includes a light emitting chip which generates a first light; a first resonator disposed on the light emitting chip; and a second resonator disposed on the first resonator. In such an embodiment, the first resonator includes a first half mirror layer; a second half mirror layer disposed on the first half mirror layer; and a first cavity layer which is disposed between the first half mirror layer and the second half mirror layer and generates a second light having a second color different from the first color, where the first resonator resonates the second light. In such embodiment, the second resonator includes a third half mirror layer, a fourth half mirror layer, and a second cavity layer which is disposed between the third half mirror layer and the fourth half mirror layer and generates a third light different from the first light and the second light, where the second resonator resonates the third light. In such embodiments, each of the first to fourth half mirror layers may include a plurality of inorganic layers which are alternatingly stacked one on another and have different refractive indices from each other.

In some embodiments, the second half mirror layer and the third half mirror layer may be a single half mirror layer.

In other embodiments, the light emitting device may further include a body member, in which an inner space is defined, where the light emitting chip is disposed on a surface thereof defining the inner space to expose the light emitting chip, and the first resonator and the second resonator may be disposed in the inner space.

In still other embodiments, the light emitting device may further include an encapsulation member disposed in the inner space and filled between the first resonator and the light emitting chip, where the encapsulation member may encapsulate the light emitting chip and may diffuse the first light.

BRIEF DESCRIPTION OF THE DRAWINGS

The above and other features of the invention will become readily apparent by reference to the following detailed description when considered in conjunction with the accompanying drawings, in which.

DETAILED DESCRIPTION

Figure 1:
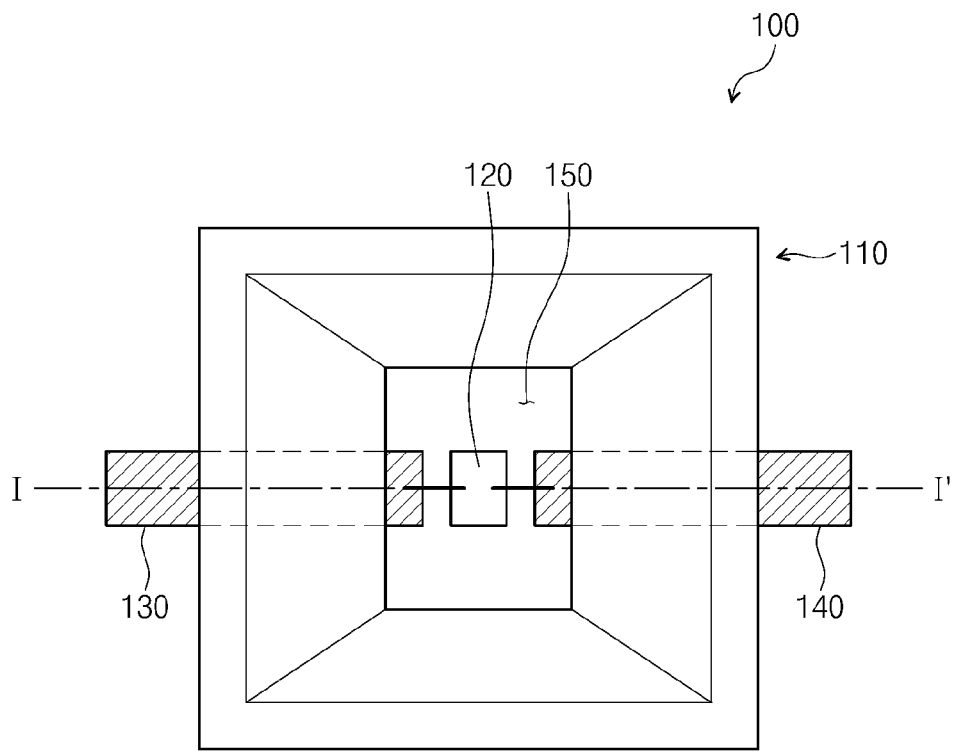
FIG. 1 is a plan view illustrating an exemplary embodiment of a light emitting device according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 2:
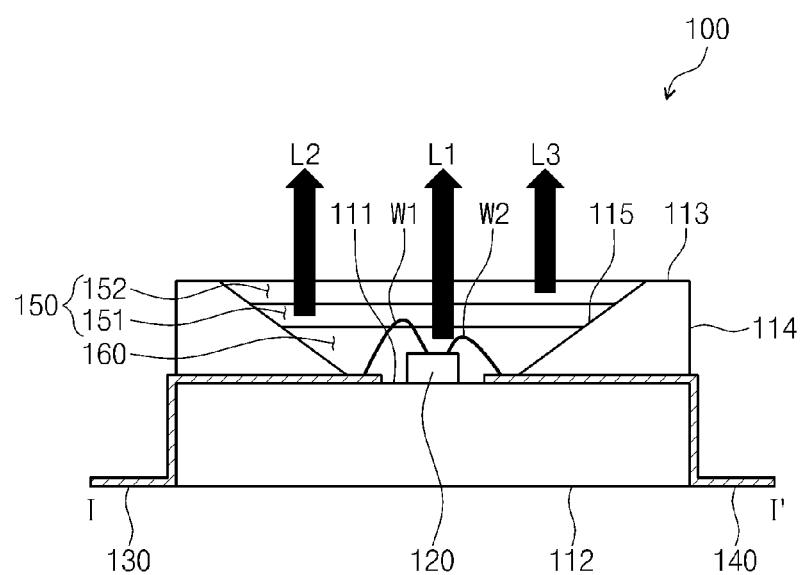
FIG. 2 is a cross sectional view taken along line I-I' of FIG. 1.
Figure 3:
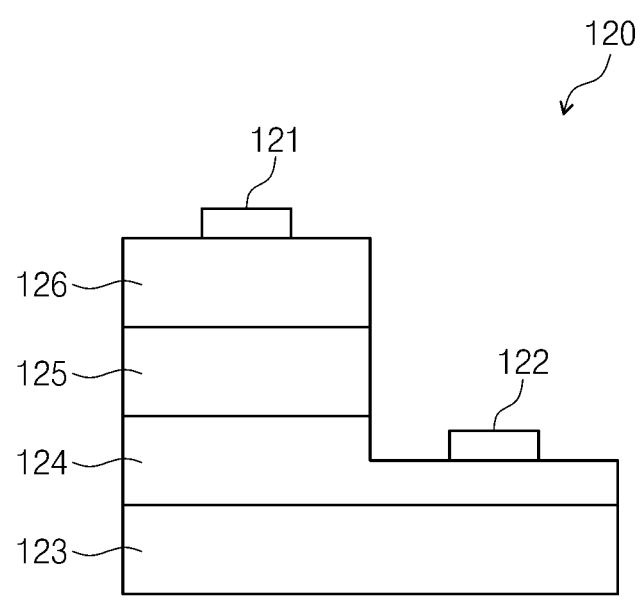
FIG. 3 is a cross sectional view schematically illustrating an exemplary embodiment of a light emitting chip of FIG. 1.

FIG. 1 is a plan view illustrating an exemplary embodiment of a light emitting device according to the invention. FIG. 2 is a cross sectional view taken along line I-I' of FIG. 1. FIG. 3 is a cross sectional view schematically illustrating an exemplary embodiment of a light emitting chip of FIG. 1. Hereinafter, exemplary embodiments of a light emitting device 100 according to the invention will be described with reference to FIGS. 1 to 3.

In an exemplary embodiment, as illustrated in FIGS. 1 and 2, the light emitting device 100 includes a body member 110, a light emitting chip 120, a first lead 130, a second lead 140, an optical resonance member 150, and an encapsulation member 160. The optical resonance member 150 includes a first resonator 151 and a second resonator 152.

The body member 110 includes a plane 111, a rear surface 112, a top surface 113, a side surface 114, and an inner surface 115. The plane 111 is disposed on the rear surface 112 to be parallel to the rear surface 112. The light emitting chip 120 is disposed, e.g., mounted, on the plane 111.

The top surface 113 is disposed above the plane 111. The side surface 114 is bent from the rear surface 112 toward the top to connect the rear surface 112 and the top surface 113. The top surface 113, the side surface 114 and the rear surface 112 define an outer surface of the body member 110.

The inner surface 115 is bent from the plane 111 toward the top to connect the plane 111 and the top surface 113. The inner surface 115 may be an inclined surface which is inclined 90 degrees or more from the plane 111. The inner surface 115 and the plane 111 define a predetermined inner space that is exposed when viewed from a top view as shown in FIG. 1.

The light emitting chip 120 is disposed in the inner space. In such an embodiment, the light emitting chip 120 is disposed, e.g., mounted, on the plane 111 to be exposed to allow emit light toward an upper direction. The light emitting chip 120 is connected to the first lead 130 through a first wiring W1 and is connected to the second lead 140 through a second wiring W2.

The light emitting chip 120 generates a first light L1 by receiving a driving voltage. The first light L1 may be various colored light. In one exemplary embodiment, for example, the first light L1 may be red, green, blue, or white light. In an alternative exemplary embodiment, the light emitting chip 120 may be an ultraviolet ("UV") device that emits ultraviolet rays.

Herein, for convenience of description, an exemplary embodiment, in which the light emitting chip 120 is a light emitting diode ("LED") chip that generates blue light, will be described in detail. In such an embodiment, a wavelength of the first light L1 may be in a range of about 360 nanometers (nm) to about 480 nm. However, the invention is not limited thereto, and alternative exemplary embodiment of the light emitting chip 120 may include a light emitting device that emits light different from blue light.

FIG. 3 exemplarily illustrates a single light emitting chip which may be included in a light emitting device. Hereinafter, an exemplary embodiment of the light emitting chip 120 will be described in detail with reference to FIG. 3.

As illustrated in FIG. 3, an exemplary embodiment of the light emitting chip 120 includes an n-type semiconductor layer 124, an active layer 125, and a p-type semiconductor layer 126 which are sequentially stacked on a substrate 123. In such an embodiment, the light emitting chip 120 includes a p-type electrode 121 (hereinafter, referred to as "first electrode") connected to the p-type semiconductor layer 126 and an n-type electrode 122 (hereinafter, referred to as "second electrode").

The substrate 123 include or is formed of a transparent material including sapphire ($Al_2O_3$), or may include or be formed of at least one selected from zinc oxide (ZnO), gallium nitride (GaN), silicon carbide (SiC) and aluminum nitride (AlN). The substrate 123 may be removed by laser lift-off, etching, grinding, or other techniques.

In such an embodiment, the n-type semiconductor layer 124, the active layer 125 and the p-type semiconductor layer 126 may be epitaxial layers which are grown on the substrate 123. The epitaxial layers may be formed of a different material based on the wavelength of the light generated by the light emitting chip 120. In one exemplary embodiment, for example, where the first light is blue light, epitaxial layers may be GaN based layers.

In such an embodiment, the n-type semiconductor layer 124 may include or be composed of an n-type nitride semiconductor layer such as GaN doped with n-type impurity or GaN/AlGaN. In one exemplary embodiment, for example, the n-type semiconductor layer 124 may be formed by doping at least one selected from indium aluminum gallium nitride (InAlGaN), gallium nitride (GaN), aluminum gallium nitride (AlGaN), indium gallium nitride (InGaN), aluminum nitride (AlN), indium nitride (InN), or aluminum indium nitride (AlInN) with silicon (Si), germanium (Ge), tin (Sn) and carbon (C).

The p-type semiconductor layer 126 may include or be composed of a p-type nitride semiconductor layer doped with p-type impurity. In one exemplary embodiment, for example, the p-type semiconductor layer 126 may be formed by doping at least one selected from InAlGaN, GaN, AlGaN, InGaN, MN, InN, or AlInN with magnesium (Mg), zinc (Zn), calcium (Ca), strontium (Sr) and barium (Ba).

The active layer 125 is disposed between the n-type semiconductor layer 124 and the p-type semiconductor layer 126. Electrons injected from the n-type semiconductor layer 124 and holes injected from the p-type semiconductor layer 126 are combined together in the active layer 125.

The active layer 125 generates light corresponding to an energy bandgap of the active layer 125. The wavelength of the light generated from the light emitting chip 120 may be changed based on a difference in the bandgap of the active layer 125.

The active layer 125 may have at least one of a single quantum well structure, a multi quantum well ("MQW") structure, a quantum dot structure, and a quantum wire structure. In an exemplary embodiment, the active layer 125 may have a structure, in which a plurality of quantum well layers and a plurality of quantum barrier layers are alternatingly stacked, but not being limited thereto.

The first electrode 121 electrically contacts the p-type semiconductor layer 126, and the second electrode 122 electrically contacts the n-type semiconductor layer 124. The first electrode 121 and the second electrode 122 provide the driving voltage, which is supplied from the outside of the light emitting device 100, to the light emitting chip 120.

Referring back to FIGS. 1 and 2, the first lead 130 and the second lead 140 are insulated from each other and fixed to the body member 110. The first lead 130 and the second lead 140 are electrically connected to the light emitting chip 120.

The light emitting chip 120 is connected to the first lead 130 and the second lead 140 through the wirings W1 and W2. The driving voltage applied from the outside is supplied to the light emitting chip 120 through the first lead 130, and the driving voltage subjected to voltage drop is outputted to the outside of the light emitting chip 120 through the second lead 140.

In an exemplary embodiment, in the light emitting chip 120, a first voltage is provided to the first electrode 121 through the first lead 130 and a second voltage having a lower potential than the first voltage is provided to the second electrode 122 through the second lead 140, such that a potential difference between the first voltage and the second voltage is substantially the same as the level of the dropped driving voltage.

The first lead 130 and the second lead 140 may include at least one selected from titanium (Ti), copper (Cu), nickel (Ni), gold (Au), chromium (Cr), tantalum (Ta), platinum (Pt), Sn, silver (Ag), phosphorus (P), aluminum (Al), indium (In), palladium (Pd), cobalt (Co), Si, Ge, hafnium (Hf), ruthenium (Ru), iron (Fe), and a combination (e.g., an alloy) thereof.

A portion of each of the first lead 130 and the second lead 140 is disposed in the inner space and protrudes to the outside of the body member 110 by penetrating through the body member 110. The portions of each of the first lead 130 and the second lead 140 protruded to the outside of the body member 110 are connected to an external power supply.

In an exemplary embodiment, the first electrode 121 and an end portion of the first lead 130 may be connected through the first wiring W1, and the second electrode 122 and an end portion of the second lead 140 may be connected through the second wiring W2. The connection between the light emitting chip 120 to the external power supply is not limited to the above described connection method. In an alternative exemplary embodiment, the light emitting chip 120 may be mounted by various methods.

In one alternative exemplary embodiment, for example, the light emitting chip 120 may be mounted by a flip chip method. In such an embodiment, the light emitting chip 120 may be directly bonded to any one of the first lead 130 and the second lead 140, and may be connected to any one of the first lead 130 and the second lead 140 through a wiring.

In another alternative exemplary embodiment, the light emitting chip 120 may be directly mounted on a circuit board by a chip on board ("COB") method. In such an embodiment, the circuit board includes an insulation substrate and a plurality of signal wirings which is disposed on the insulation substrate and is for providing the driving voltage to the light emitting device.

In such an embodiment, the body member 110 may be omitted and the light emitting device may further include a hemispherical cover member that covers the light emitting chip 120. In an exemplary embodiment, the light emitting chip 120 may be mounted by various methods and is not limited to those described herein.

Although not shown in the drawings, the light emitting device 100 may further include a heat sink. The heat sink may penetrate through a portion of the body member 110 to be fixed to the body member 110. The heat sink may be in contact with the light emitting chip 120 to effectively prevent the degradation of the light emitting chip 120.

The first resonator 151 is disposed in the inner space on the light emitting chip 120. The first resonator 151 generates a second light L2 by absorbing at least a portion of the first light L1, and the first resonator 151 resonates the generated second light L2.

The second resonator 152 is disposed in the inner space and is disposed on the first resonator 151. The second resonator 152 generates a third light L3 by absorbing at least a portion of the first light L1 and the second light L2, and the second resonator 152 resonates the generated third light L3.

According to an exemplary embodiment, the second light L2 and the third light L3 may improve the efficiency of the light emitting device by being amplified by optical resonance effects. In such an embodiment, a full width at half maximum ("FWHM") of the light resonated due to the resonance effects may have a decreased wavelength spectrum, such that color purity may be improved. In an exemplary embodiment, the light emitting device 100 further includes the first resonator 151 and the second resonator 152, such that luminous efficiency and color reproducibility are improved.

The encapsulation member 160 fills a space between the first resonator 151 and the light emitting chip 120 in the inner space. The encapsulation member 160 encapsulates the light emitting chip 120 to fix the light emitting chip 120 and protects the light emitting chip 120 from the outside, e.g., from external impact or moisture.

The encapsulation member 160 may diffuse the first light L1. The first light L1 emitted from the light emitting chip 120 may be uniformly incident on the entire surface of the first resonator 151 by being diffused through the encapsulation member 160.

Although not shown in the drawings, in an exemplary embodiment where the light emitting chip 120 is directly mounted on the circuit board, the encapsulation member 160 may fill the inner space defined by the cover member. In an alternative exemplary embodiment, the encapsulation member 160 of the light emitting device 100 may be omitted.

Figure 4A:
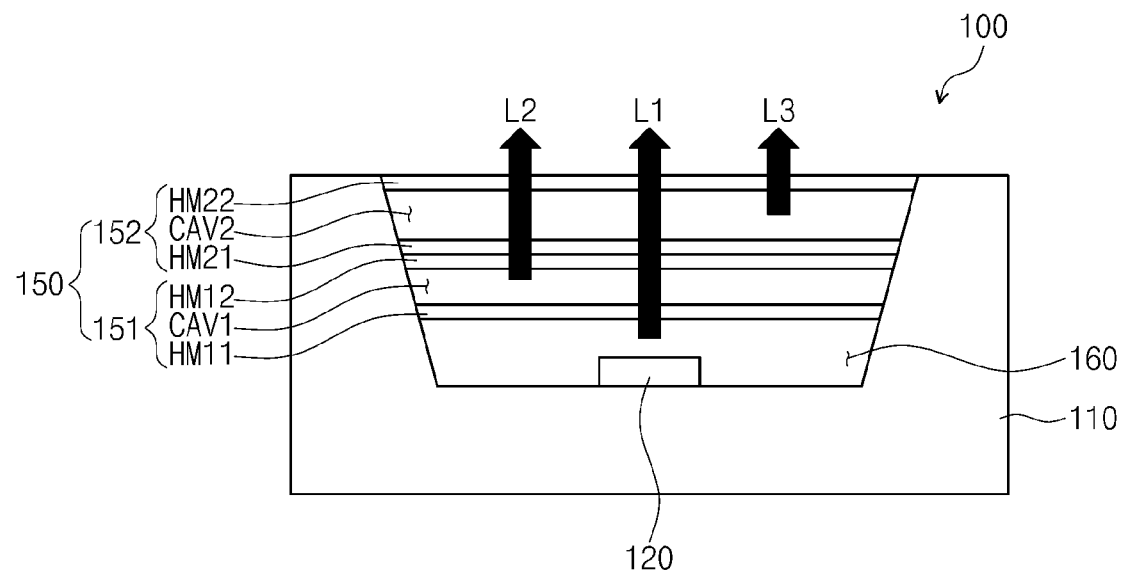
FIG. 4A is a cross sectional view illustrating an exemplary embodiment of the light emitting device according to the invention.
Figure 4B:
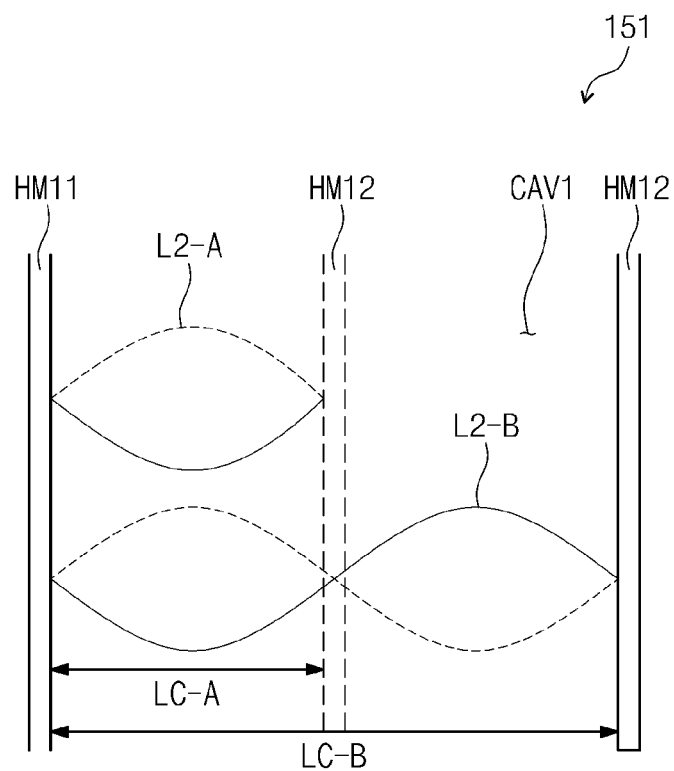
FIG. 4B schematically illustrates an exemplary embodiment of an optical resonance member according to the invention.

FIG. 4A is a cross sectional view illustrating an exemplary embodiment of the light emitting device according to the invention, and FIG. 4B schematically illustrates an exemplary embodiment of an optical resonance member according to the invention. Hereinafter, luminescent characteristics of an exemplary embodiment of the light emitting device 100 according to the invention will be described with reference to FIGS. 4A and 4B. The same reference numerals are provided for the same elements as those shown in FIGS. 1 to 3, and any repetitive detailed descriptions thereof will be omitted.

In an exemplary embodiment, as illustrated in FIG. 4A, the first resonator 151 and the second resonator 152 may each include a plurality of half mirror layers and a cavity layer disposed or defined between the half mirror layers. In such an embodiment, the first resonator 151 may include a first half mirror layer (or a first lower half mirror layer) HM11, a second half mirror layer (or a first upper half mirror layer) HM12, and a first cavity layer CAV1.

Each of the half mirror layers selectively transmits or reflects the incident light according to its wavelength. Since the light has a color corresponding to its wavelength, the half mirror layers selectively transmit or reflect the light according to its color.

The first half mirror layer HM11 and the second half mirror layer HM12 each transmit the first light L1 and reflect the second light L2. Accordingly, the first light L1 emitted from the light emitting chip 120 may be incident on the first cavity layer CAV1 through the first half mirror layer HM11.

The first cavity layer CAV1 generates the second light L2 by absorbing at least a portion of the first light L1. Since the second light L2 is generated based on the first light L1, the second light L2 generally has a longer wavelength than the wavelength of the first light L1. In one exemplary embodiment, for example, where the first light L1 is blue light, the second light L2 may be green light having a wavelength in a range of about 480 nm to about 560 nm.

The generated second light L2 is again reflected into the first cavity layer CAV1 by the first half mirror layer HM11 and the second half mirror layer HM12. In such an embodiment, when the first cavity layer CAV1 satisfies a resonance condition, the second light L2 resonates in the first resonator 151.

Hereinafter, the resonance condition will be described in detail with reference to FIG. 4B. FIG. 4B exemplarily illustrates an exemplary embodiment in which the first resonator 151 satisfies the resonance condition. For convenience of illustration, a thickness direction of the first resonator 151 is aligned in the left and right direction in FIG. 4B.

As illustrated in FIG. 4B, if it is assumed that there is no change in the refractive index of the first cavity layer CAV1, the first resonator 151 may resonate the second light L2 when the first cavity layer CAV1 is set to have a first thickness LC-A or a second thickness LC-B.

A resonance condition is satisfied for a predetermined cavity layer to resonate light having a predetermined wavelength. The resonance condition is given by the following Equation 1.

$$L_{CAV} = \frac{\lambda_l}{2n_{CAV}} m \quad \text{[Equation 1]}$$

In Equation 1, $L_{CAV}$ denotes a thickness of the cavity layer, $n_{CAV}$ denotes a refractive index of the cavity layer, and $\lambda_l$ denotes a wavelength of the light to resonate.

That is, in order for the first cavity layer CAV1 to resonate the second light L2, a product of the refractive index ($n_{CAV}$) and the thickness ($L_{CAV}$) satisfies an integer (m) multiple of a half wavelength of the second light L2. Herein, the integer (m) denotes a natural number, that is an integer equal to or greater than 1.

When the first cavity layer CAV1 satisfies the resonance condition, the second light L2 is amplified while resonating in the first cavity layer CAV1 by being reflected from the first half mirror layer HM11 and the second half mirror layer HM12.

In an exemplary embodiment in which the first cavity layer CAV1 has the first thickness LC-A, the product of the refractive index and the thickness is equivalent to one times the half wavelength of the second light L2. Accordingly, when the second light L2 is again reflected from the second half mirror layer HM12 to the first half mirror layer HM11 after being reflected from the first half mirror layer HM11 to the second half mirror layer HM12, the second light L2 resonates to form a complete wavelength.

In an exemplary embodiment in which the first cavity layer CAV1 has the second thickness LC-B, the product of the refractive index and the thickness is equivalent to two times the half wavelength of the second light L2. Accordingly, the second light L2 resonates to form a complete wavelength while being reflected from the first half mirror layer HM11 to the second half mirror layer HM12.

As illustrated in FIG. 4B, when the resonance condition is satisfied, the thickness of the cavity layer becomes an optical resonator length. In general, when the optical resonator length is large, the number of resonances is relatively increased. However, gain may be decreased to reduce the resonance effects.

In an exemplary embodiment of the invention, the resonators may have a micro resonance structure having a short optical resonator length. In an exemplary embodiment, the thickness of the cavity layer may be about 3 times (3λ) or less the wavelength of the resonant light.

Referring back to FIG. 4A, in an exemplary embodiment, the second resonator 152 is disposed on the first resonator 151. The second resonator 152 may include a third half mirror layer (or a second lower half mirror layer) HM21, a fourth half mirror layer (or a second upper half mirror layer) HM22, and a second cavity layer CAV2.

The third half mirror layer HM21 and the fourth half mirror layer HM22 each transmit the first light L1 and the second light L2 and reflect the third light L3. Accordingly, the first light L1 and the second light L2 may be incident on the second cavity layer CAV2.

The second cavity layer CAV2 generates the third light L3 by absorbing at least a portion of the first light L1 and/or at least a portion of the second light L2. Since the third light L3 is generated based on the first light L1 and/or the second light L2, the wavelength of the third light L3 is generally longer than the wavelength of the first light L1 and the wavelength of the second light L2. In one exemplary embodiment, for example, where the first light L1 is blue light and the second light L2 is green light, the third light may be red light having a wavelength in a range of about 640 nm to about 780 nm.

The generated third light L3 is again reflected into the second cavity layer CAV2 by the third half mirror layer HM21 and the fourth half mirror layer HM22. In this case, when the second cavity layer CAV2 satisfies the resonance condition, the third light L3 resonates in the second resonator 152. Referring to the above described resonance condition, when the product of the refractive index and thickness of the second cavity layer CAV2 becomes an integer multiple of a half wavelength of the third light L3, the third light L3 resonates in the second cavity layer CAV2.

In an exemplary embodiment, where the first light L1, the second light L2 and the third light L3 have sequentially longer wavelengths and the first cavity layer CAV1 and the second cavity layer CAV2 substantially have the same refractive index as each other, the thickness of the second cavity layer CAV2 may be greater than the thickness of the first cavity layer CAV1.

In an exemplary embodiment, the first cavity layer CAV1 and the second cavity layer CAV2 may include or be formed of substantially the same material as each other. Accordingly, in such an embodiment, the first cavity layer CAV1 and the second cavity layer CAV2 substantially have the same refractive index as each other.

In an exemplary embodiment where the first cavity layer CAV1 and the second cavity layer CAV2 each have a micro resonance structure, the integer m of Equation 1 may be a natural number of 6 or less. In an exemplary embodiment, the thicknesses of the first cavity layer CAV1 and the second cavity layer may be in a range of about 0.1 µm to about 1.0 µm. Accordingly, the first cavity layer CAV1 and the second cavity layer CAV2 may have a relatively improved resonance effect with respect to a predetermined refractive index.

In an exemplary embodiment, the light emitting device 100 may resonate lights having different wavelengths by adjusting the thicknesses of the first cavity layer CAV1 and the second cavity layer CAV2. Accordingly, the luminous efficiency of the light emitting device 100 may be improved. In an exemplary embodiment, where the first to third lights L1, L2 and L3 are mixed to form white light, the light emitting device 100 may generate uniform white light.

Figure 5:
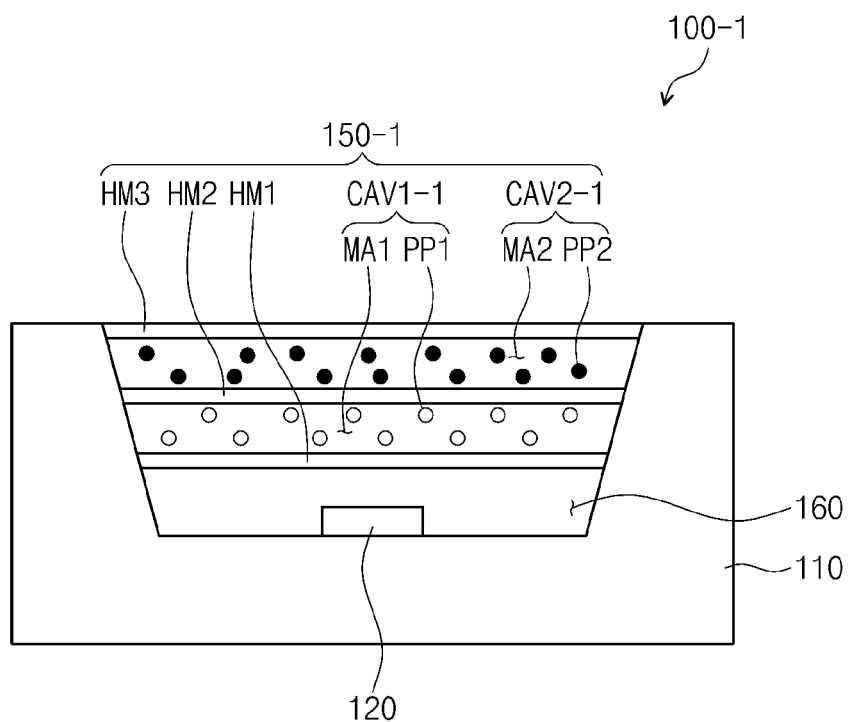
FIG. 5 is a cross sectional view illustrating an exemplary embodiment of a light emitting device according to the invention.
Figure 6:
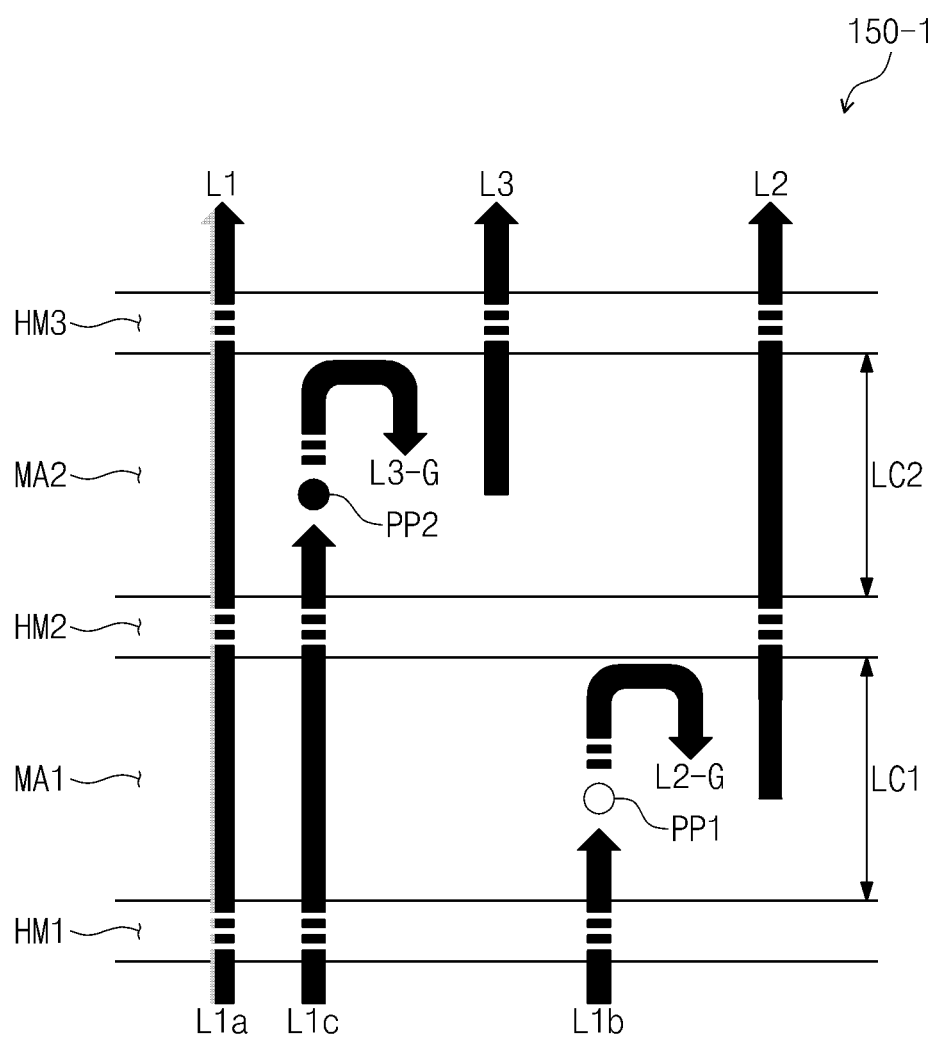
FIG. 6 illustrates an optical path in an optical resonance member illustrated in FIG. 5.

FIG. 5 is a cross sectional view illustrating an exemplary embodiment of a light emitting device according to the invention, and FIG. 6 illustrates an optical path in an optical resonance member illustrated in FIG. 5. Hereinafter, luminescent characteristics of a light emitting device 100-1 will be described with reference to FIGS. 5 and 6. The same reference numerals are provided for the same elements as those shown in FIGS. 1 to 4B, and any repetitive detailed descriptions thereof will be omitted.

In an exemplary embodiment, as illustrated in FIG. 5, an optical resonance member 150-1 includes a first half mirror layer HM1, a first cavity layer CAV1-1, a second half mirror layer HM2, a second cavity layer CAV2-1, and a third half mirror layer HM3 which are sequentially stacked in an upward direction.

The first cavity layer CAV1-1 may include a first base material MA1 and a first phosphor PP1. As described above, the first cavity layer CAV1-1 generates the second light L2 while simultaneously resonating the second light L2.

Since the first cavity layer CAV1-1 includes the first phosphor PP1, the first cavity layer CAV1-1 may generate the second light L2 by absorbing the first light L1. Similarly, the second cavity layer CAV2-1 may include a second base material MA2 and a second phosphor PP2.

In such an embodiment, the first base material MA1 and the second base material MA2 may be base members for respectively fixing the first phosphor PP1 and the second phosphor PP2. In such an embodiment, the first base material MA1 diffuses light incident on the first cavity layer CAV1-1, and the second base material MA2 diffuses light incident on the second cavity layer CAV2-1.

The first base material MA1 has a first refractive index. The first base material MA1 may include or be formed of a transparent insulation material. In one exemplary embodiment, for example, the first base material MA1 may include a resin based material, such as an epoxy, or Si.

The second base material MA2 may include or be formed of a material having a second refractive index. The second base material MA2 may include or be formed of the same material as the first base material MA1 while having a thickness different from that of the first base material MA1.

In an exemplary embodiment where the first base material MA1 and the second base material MA2 are formed of the same material as each other, the light emitting device 100-1 may respectively resonate lights having different wavelengths only by differing the thicknesses of the first base material MA1 and the second base material MA2 while using the existing material. However, the first base material MA1 and the second base material MA2 may include or be formed of various materials, not being limited to those described above.

The first phosphor PP1 and the second phosphor PP2 may be provided in plural to be respectively dispersed in the first base material MA1 and the second base material MA2. The first phosphor PP1 and the second phosphor PP2 respectively generate lights having different wavelengths from those of the incident lights by respectively absorbing portions of the lights incident on the first cavity layer CAV1-1 and the second cavity layer CAV2-1.

In an exemplary embodiment, the first phosphor PP1 generates a second light L2-G different from the first light L1 by absorbing at least a portion of the first light L1. The first phosphor PP1 emits the second light L2-G while being in an excited state by absorbing at least a portion of the first light and being stabilized again. In general, the second light L2-G has a wavelength longer than the wavelength of the first light L1.

In the drawing, the second light L2-G generated in the optical resonance member 150-1, and the resonated and emitted second light L2 are illustrated with different reference numerals. However, the two lights are distinguished for convenience of description, and the two lights are substantially the same as the second light L2 of FIG. 2.

The second phosphor PP2 generates a third light L3-G different from the first light L1 and the second light L2 by absorbing at least a portion of the first light L1 and the second light L2. In general, the third light L3-G has a longer wavelength than the wavelengths of the first light L1 and the second light L2.

In the drawing, the third light L3-G generated in the optical resonance member 150-$l$ and the resonated and emitted third light L3 are illustrated with different reference numerals. However, the two lights are distinguished for convenience of description, and the two lights are substantially the same as the third light L3 of FIG. 2.

The first phosphor PP1 and the second phosphor PP2 may include or be formed of a material which emits light by receiving energy. In one exemplary embodiment, For example, at least one of the first phosphor PP1 and the second phosphor PP2 may be powder particles including or formed of an inorganic compound.

The inorganic compound may include at least one selected from yttrium aluminum oxide garnet ("YAG"), terbium aluminum garnet ("TAG"), silicate, a nitride based material, and an oxynitride based material.

In an exemplary embodiment, as described above, the optical resonance member 150-$l$ according to the invention may have a micro resonance structure. Accordingly, each of a thickness LC1 of the first base material MA1 and a thickness LC2 of the second base material MA2, which determines thicknesses of the cavity layers CAV1-1 and CAV2-1, may be set to be about 1.0 µm or less.

In an exemplary embodiment, the first phosphor PP1 and the second phosphor PP2 may be deposited by a sputtering process or a pulsed laser deposition ("PLD") process using a phosphor target in powder form. Accordingly, the first phosphor PP1 and the second phosphor PP2 may be uniformly dispersed respectively in the first base material MA1 and the second base material MA2, each having a small thickness.

Each of the first phosphor PP1 and the second phosphor PP2 may be at least one selected from a red phosphor, a green phosphor and a yellow phosphor. In an exemplary embodiment, the first phosphor PP 1 may be a green phosphor, and the second phosphor PP2 may be a red phosphor.

In an exemplary embodiment, at least one of the first phosphor PP1 and the second phosphor PP2 may be a quantum dot ("QD") phosphor. Electrical and optical properties of the quantum dot phosphor may be changed due to three dimensional quantum confinement effects.

The quantum dot phosphor generates different light according to the size thereof. In general, the smaller the size of the quantum dot phosphor is, the shorter the wavelength of the emitted light is, and the greater the size of the quantum dot phosphor is, the longer the wavelength of the emitted light is. In an exemplary embodiment, the first phosphor PP1 may be a quantum dot phosphor which is smaller than the second phosphor PP2.

In an exemplary embodiment where the first phosphor PP1 and the second phosphor PP2 are quantum dot phosphors, since the first phosphor PP1 and the second phosphor PP2 may have a size of a few nanometers, the first phosphor PP1 and the second phosphor PP2 may be easily dispersed respectively in the base materials MA1 and MA2 each having a small thickness of about 1 nm or less. The first phosphor PP1 and the second phosphor PP2 may be formed by various processes, for example, may be formed by a printing process or a spray coating process.

As described above, in an exemplary embodiment, the optical resonance member 150 1 may include three half mirror layers. In one exemplary embodiment, for example, the second half mirror layer HM2 may define a first resonator together with the first half mirror layer HM1 and the first cavity layer CAV1-1 and may simultaneously define a second resonator together with the third half mirror layer HM3 and the second cavity layer CAV2-1. Accordingly, the second half mirror layer HM2-1 may have reflection characteristics in which the second half mirror layer HM2-1 reflects the second light L2 and simultaneously reflects the third light L3.

The optical path in an exemplary embodiment of the optical resonance member 150-*l* will be described with reference to FIG. 6. As illustrated in FIG. 6, the first light L1 generated from the light emitting chip 120 may entirely transmit the first half mirror layer HM1.

A portion L1*a* of the first light is emitted to the outside by entirely transmitting the optical resonance member 150-*l*. The portion L1*a* of the first light becomes the first light L1 which maintains the existing first color as it is.

Another portion L1*b* of the first light becomes an energy source for generating the second light L2 by being absorbed in the first phosphor PP1 in the first cavity layer CAV1-1. The generated second light L2 resonates in the first base material MA1 having a resonance thickness LC1 by being re-reflected by the second half mirror layer HM2.

When an angle of incidence, at which the second light L2-C arrives at the second half mirror layer HM2 after being resonated a predetermined number of times, is greater than a predetermined angle, the second light L2-C may be emitted to the outside by transmitting the second half mirror layer HM2. Accordingly, the resonated and emitted second light L2-C has higher brightness and color purity than the second light L2 generated by the first phosphor PP1.

Another portion L1*c* of the first light transmits the second half mirror layer HM2 and may then arrive at the second cavity layer CAV2-1. In this case, the another portion L1*c* of the first light becomes an energy source for generating the third light L3 by being absorbed in the second phosphor PP2 in the second base material MA2.

The generated third light L3 resonates in the second base material MA2 having a resonance thickness LC2 by being re-reflected by the third half mirror layer HM3. The third light L3-C may be emitted to the outside after being resonated a predetermined number of times. Accordingly, the resonated and emitted third light L3-C has higher brightness and color purity than the third light L3 generated by the second phosphor PP2.

In an exemplary embodiment of the light emitting device 100 *l* according to the invention, the thickness of the optical resonance member 150-*l* may be reduced by including two resonators which share a single half mirror layer. In such an embodiment, where two resonators share a single half mirror layer, a manufacturing process may be simplified and manufacturing costs may be reduced.

Figure 7:
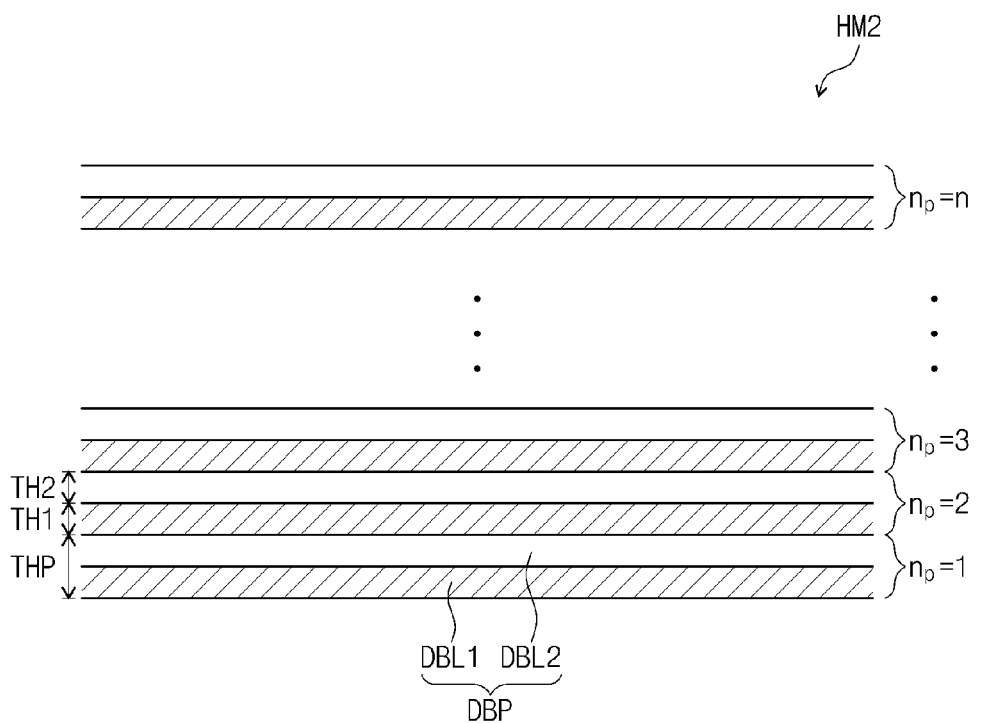
FIG. 7 is a cross sectional view illustrating an exemplary embodiment of a half mirror layer according to the invention.
Figure 8A:
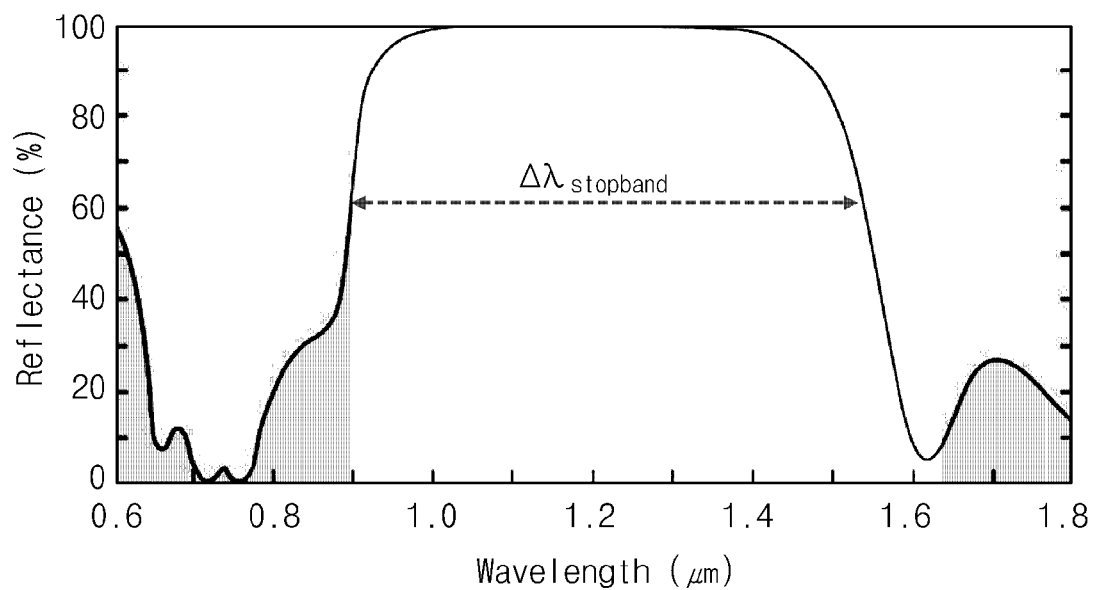
FIGS. 8A and 8B are graphs illustrating reflection spectrums according to the number of single layer thin film pairs illustrated in FIG. 7.
Figure 8B:
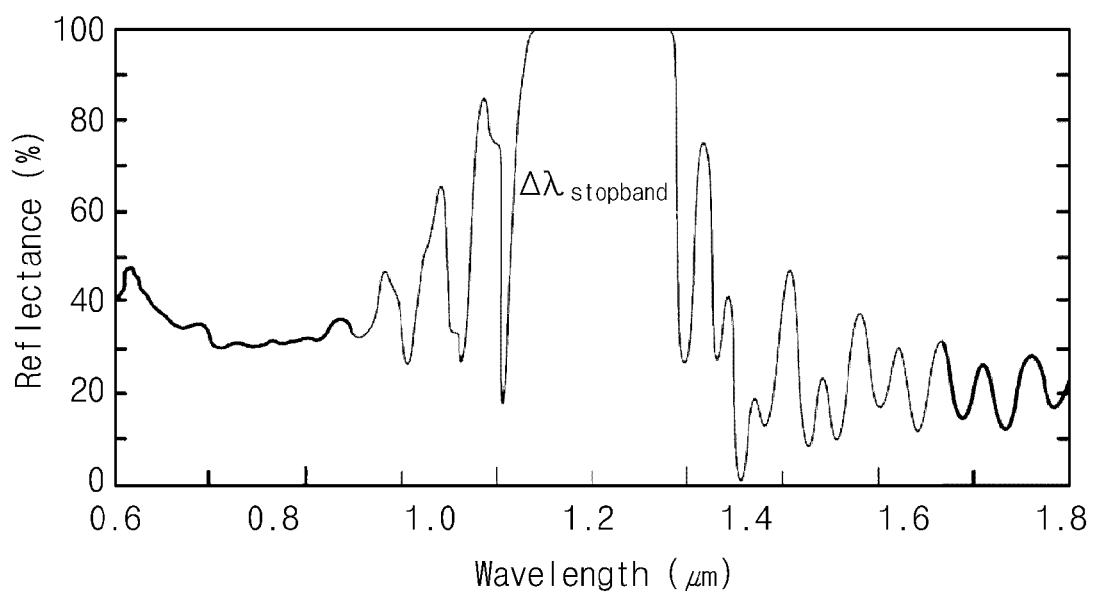

FIG. 7 is a cross sectional view illustrating an exemplary embodiment of a half mirror layer according to the invention, and FIGS. 8A and 8B are graphs illustrating reflection spectrums according to the number of single layer thin film pairs illustrated in FIG. 7.

FIG. 7 shows an exemplary embodiment of a second half mirror layer HM2 (hereinafter, referred to as "half mirror layer"). Hereinafter, such an embodiment of the half mirror layer will be described in greater detail with reference to FIGS. 7 through 8B. FIG. 7 exemplarily illustrates a single half mirror layer which may be included in a light emitting device.

As illustrated in FIG. 7, an exemplary embodiment of the half mirror layer may be a distributed Bragg reflector ("DBR"). Accordingly, the half mirror layer includes a multilayer thin film pair DBP. FIG. 7 shows an exemplary embodiment where the half mirror layer HM2 includes n multilayer thin film pairs DBP.

The single multilayer thin film pair DBP may be alternatingly stacked and may include a plurality of inorganic layers, e.g., a first inorganic layer DBL1 and a second inorganic layer DBL2, having different refractive indices from each other. The first inorganic layer DBL1 has a first refractive index and has a first thickness TH1. The second inorganic layer DBL2 is disposed on the first inorganic layer DBL1 and has a second thickness TH2.

In such an embodiment, the multilayer thin film pair DBP may be defined by the first inorganic layer DBL1 and the second inorganic layer DBL2. Thus, a thickness THP of the single multilayer thin film pair DBP may be a sum of the first thickness TH1 and the second thickness TH2.

In an exemplary embodiment where the plurality of inorganic layers DBL1 and DBL2 satisfies a predetermined reflection condition, the multilayer thin film pair DBP including the plurality of inorganic layers DBL1 and DBL2 may reflect light having a specific wavelength. The reflection condition is given by the following Equation 2.

$$TH = \frac{\lambda_2}{4n_{HM}} \qquad \text{[Equation 2]}$$

In Equation 2, TH denotes a thickness of the inorganic layer, $n_{HM}$ denotes a refractive index of the inorganic layer, and $\lambda_2$ denotes a wavelength of the light to reflect)

Equation 2 defines a relationship between the thickness and the refractive index in which reflectance is maximized based on Bragg's law. As illustrated in Equation 2, when physical properties of the first inorganic layer DBL1 and physical properties of the second inorganic layer DBL2 are controlled, the light having a specific wavelength may be selectively reflected from the multilayer thin film pair DBP.

The reflectance of the multilayer thin film pair DBP is given by the following Equation 3.

$$R_{DBR} = \left[ \frac{1 - (n_1/n_2)^{2k}}{1 + (n_1/n_2)^{2k}} \right]^2 \quad \text{[Equation 3]}$$

The reflectance $R_{DBR}$ of the multilayer thin film pair, which includes or is composed of k pairs of different inorganic layers respectively having refractive indices of $n_1$ and $n_2$, may be calculated by Equation 3.

In such an embodiment, when a product of the refractive index and the thickness of the first inorganic layer DBL1 is about ¼ of the wavelength of the second light L2 (see FIG. 6) and a product of the refractive index and the thickness of the second inorganic layer DBL2 is about ¼ of the wavelength of the second light L2, the multilayer thin film pair DBP reflects the second light L2.

In an exemplary embodiment, where each of the plurality of multilayer thin film pairs DBP constituting the half mirror layer HM2 includes the first inorganic layer DBL1 and the second inorganic layer DBL2 which satisfy the reflection condition, the half mirror layer HM2 reflects the second light L2. Since light having a wavelength different from the wavelength of the second light L2 does not satisfy the reflection condition, the light transmits the half mirror layer HM2.

Accordingly, the half mirror layer HM2 may selectively transmit or reflect the light having a specific wavelength. A thickness of the half mirror layer HM2 may be in a range of about 0.6 μm to about 10 μm.

Each of the plurality of inorganic layers DBL1 and DBL2 may include or be formed of various materials. In an exemplary embodiment, each of the plurality of inorganic layers DBL1 and DBL2 may be a dielectric layer. In one exemplary embodiment, for example, each of the plurality of inorganic layers DBL1 and DBL2 may include at least one selected from silicon oxide ($SiO_2$), titanium oxide ($TiO_2$), silicon nitride (SiNx), hafnium oxide ($HfO_2$) and zirconium oxide ($ZrO_2$).

In general, the refractive index of an inorganic layer may be determined by a material constituting the corresponding inorganic layer. An exemplary embodiment of the light emitting device according to the invention may include a resonator which corresponds to various wavelengths by selectively reflecting or transmitting light having various wavelengths by adjusting the thickness of an existing inorganic layer material even if the existing inorganic layer material is used.

In an exemplary embodiment, the number np of the multilayer thin film pairs DBP constituting the half mirror layer HM2 may be variously defined. In general, when the refractive index is a fixed factor, the greater the number np of the multilayer thin film pairs DBP is, the higher the reflectance of the half mirror layer HM2 is. However, the thickness of the half mirror layer HM2 is increased.

The number np of the multilayer thin film pairs DBP having a predetermined reflectance may be changed according to a difference between the refractive indices of the first inorganic layer DBL1 and the second inorganic layer DBL2, and, accordingly, the reflection spectrum of the half mirror layer HM2 may be changed.

In FIGS. 8A and 8B, a substantially reflected wavelength band is represented as a reflection area ($\Delta\lambda_{stopband}$). This will be described in detail with reference to FIGS. 8A and 8B.

FIG. 8A illustrates the reflection spectrum of an exemplary embodiment in which the first inorganic layer DBL1 is formed of Si having a refractive index of about 2.5 and the second inorganic layer DBL2 is formed of silicon oxide ($SiO_2$) having a refractive index of about 1.5. A ratio of the refractive index of the second inorganic layer DBL2 to the refractive index of the first inorganic layer DBL1 is a value equal to or less than about 0.7, e.g., about 0.6, and a difference between the refractive index of the first inorganic layer DBL1 and the refractive index of the second inorganic layer DBL2 is about 1. Thus, the first inorganic layer DBL1 and the second inorganic layer DBL2 correspond to inorganic layers having a large difference in refractive index. In this case, the half mirror layer includes four multilayer thin film pairs.

As illustrated in FIG. 8A, when the half mirror layer includes or is composed of the inorganic layers having a large difference in refractive index, high reflectance may be obtained through a small number of the multilayer thin film pairs. However, the reflection spectrum in this case has a reflection area over a wide wavelength band.

Thus, when the half mirror layer includes or is composed of the inorganic layers having a large difference in refractive index, the half mirror layer may generally have a high reflectance regardless of the wavelength. The difference in refractive index is equal to an absolute value of subtraction between the refractive indices of the inorganic layers constituting the multilayer thin film pair.

FIG. 8B illustrates the reflection spectrum of an alternative exemplary embodiment in which the first inorganic layer DBL1 is formed of gallium arsenide (GaAs) having a refractive index of about 1.7 and the second inorganic layer DBL2 is formed of aluminum arsenide (AlAs) having a refractive index of about 1.8.

A ratio of the refractive index of the first inorganic layer DBL1 to the refractive index of the second inorganic layer DBL2 is about 0.95, and a difference between the refractive index of the first inorganic layer DBL1 and the refractive index of the second inorganic layer DBL2 is about 0.1. Thus, the first inorganic layer DBL1 and the second inorganic layer DBL2 correspond to inorganic layers having a small difference in refractive index and the two inorganic layers have substantially similar refractive indices. In this case, the half mirror layer includes 25 multilayer thin film pairs.

As illustrated in FIG. 8B, when the half mirror layer includes or is composed of the inorganic layers having a small difference in refractive index, the plurality of multilayer thin film pairs may be used to obtain a high reflectance. The reflection spectrum illustrated in FIG. 8B has a reflection area over a narrow wavelength band. Selective reflection according to the wavelength may be effectively performed as the reflection area is set to the narrow wavelength band.

As illustrated in FIGS. 7 through 8B, according to an exemplary embodiment of the invention, the reflection characteristics of the half mirror layer may be adjusted by controlling the difference between the refractive indices of the plurality of inorganic layers defining the multilayer thin film pair DBP or the number np of the multilayer thin film pairs DBP.

In one exemplary embodiment, for example, where the half mirror layer constitutes a single resonator, the half mirror layer may only reflect light having a specific wavelength range. Referring to FIG. 4A, the second half mirror layer HM2 may be designed so that the reflection area is formed in a wavelength band corresponding to the wavelength range of the second light L2.

In one exemplary embodiment, for example, where the half mirror layer is shared by the plurality of resonators, the half mirror layer reflects light having a relatively wide wavelength range. Referring to FIG. 5, a reflection area of the second half mirror layer HM2-1 may be formed over an entire wavelength band corresponding to the wavelength range of the second light L2 and the wavelength range of the third light L3. In such an embodiment, the thickness of the half mirror layer may be reduced by forming the half mirror layer using the multilayer thin film pair which includes or is composed of the inorganic layers having a small difference in refractive index.

According to exemplary embodiments of the invention, the light emitting device including the plurality of resonators may be effectively designed using the half mirror layer including or composed of a multilayer Bragg reflector. Accordingly, an exemplary embodiment the light emitting device according to the invention may provide uniform white light by improving efficiency with respect to light having various wavelengths while using an existing inorganic layer material and maintaining an existing form.

Figure 9A:
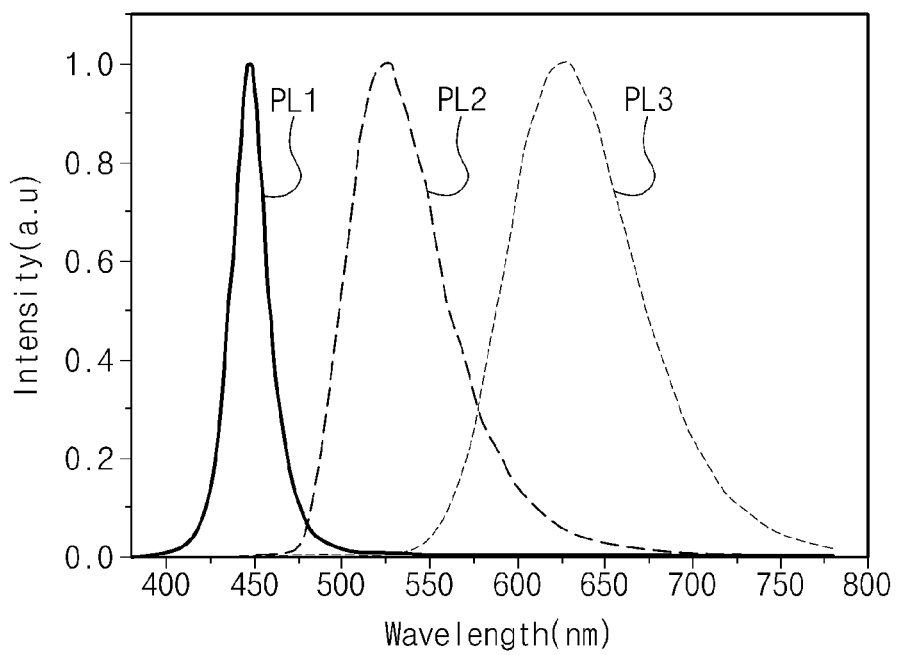
FIGS. 9A and 9B are emission spectrums respectively illustrating luminous efficiency of a comparative embodiment of a light emitting device.
Figure 9B:
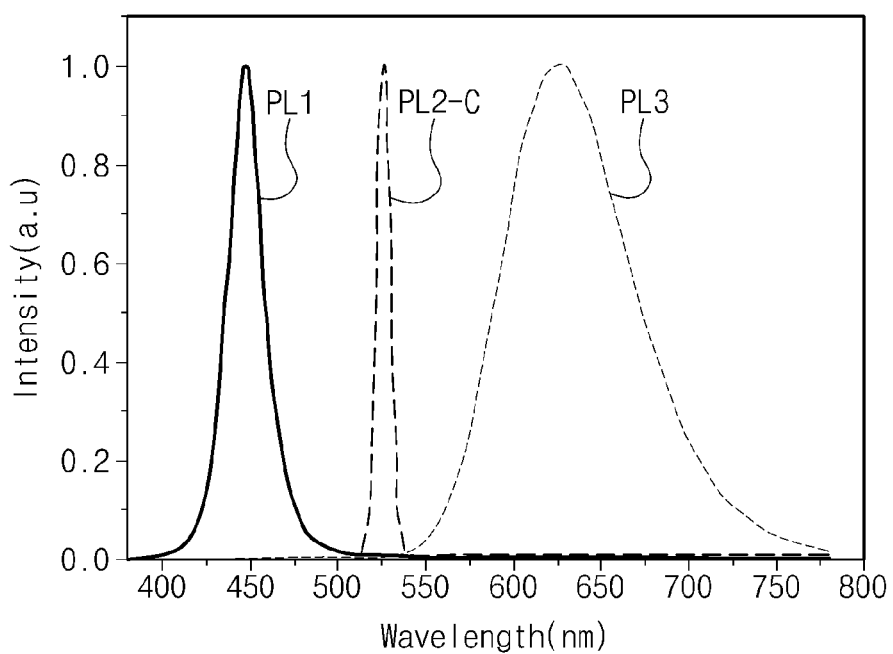
Figure 9C:
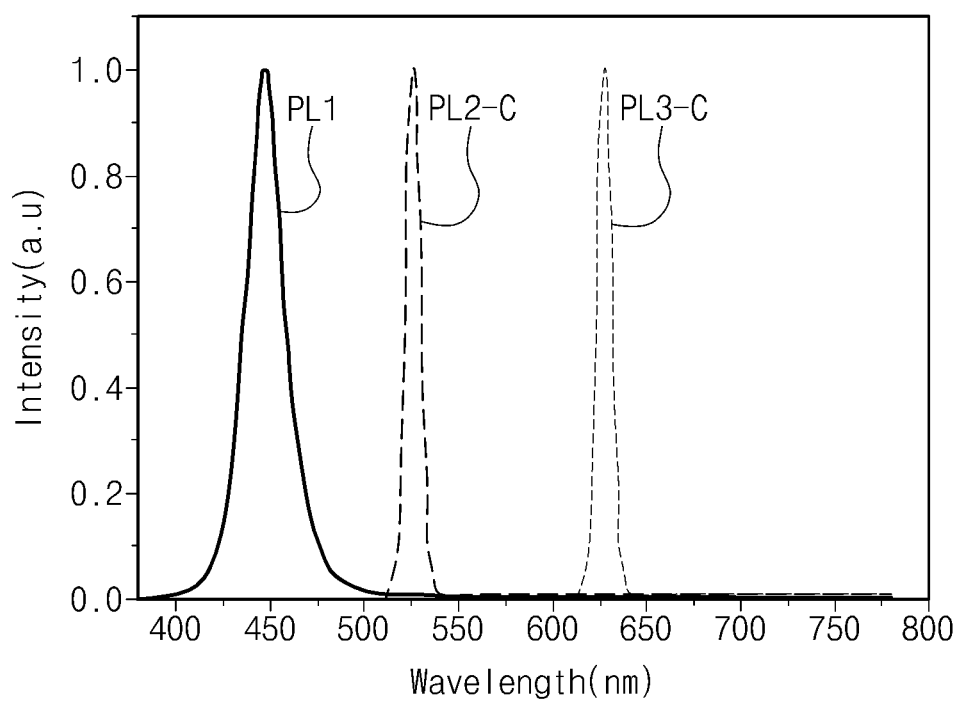
FIG. 9C is an emission spectrum illustrating luminous efficiency of an exemplary embodiment of the light emitting device according to the invention.

FIGS. 9A and 9B are emission spectrums respectively illustrating luminous efficiency of comparative embodiments of a light emitting device, and FIG. 9C is an emission spectrum illustrating luminous efficiency of an exemplary embodiment of the light emitting device according to the invention. FIGS. 9A through 9C illustrate light intensity versus wavelength. The light intensities of FIGS. 9A through 9C are illustrated on the basis that the respective maximum intensity is 1, and, accordingly, actual amounts of light are different from one another.

FIG. 9A illustrates the luminous efficiency of a comparative embodiment which does not include both the first resonator 151 (see FIG. 2) and the second resonator 152 (see FIG. 2). As illustrated in FIG. 9A, a FWHM of an emission spectrum PL1 of the first light is relatively smaller than FWHM of an emission spectrum PL2 of the second light and an emission spectrum PL3 of the third light.

In general, since only the light having a specific wavelength band may be emitted as the FWHM of the emission spectrum is small, selectivity is improved and color purity is improved. That is, in the comparative embodiment which does not include resonators, since the second light and the third light are emitted in which color purities are relatively reduced compared to that of the first light, uniformity or brightness of the white light may be substantially reduced.

FIG. 9B illustrates the luminous efficiency of a comparative embodiment which includes the first resonator 151. When compared with FIG. 9A, the FWHM of the emission spectrum PL2-C of the second light is reduced.

As described above, the first resonator 151 resonates the second light. Accordingly, since the comparative embodiment includes the first resonator 151, the resonated second light may be emitted. In this case, since the comparative embodiment does not include the second resonator 152, the emission spectrum PL3 of the third light has substantially the same shape as the comparative example of FIG. 9A.

FIG. 9C illustrates the luminous efficiency of an exemplary embodiment of the light emitting device which includes the first resonator 151 and the second resonator 152. When compared with FIG. 9A, the emission spectrum PL2-C of the second light and the emission spectrum PL3-C of the third light are exhibited in which full widths at half maximum are reduced.

As described above, the second resonator 152 resonates the third light. Accordingly, since an exemplary embodiment of the light emitting device according to the invention includes the second resonator 152, the resonated third light may be emitted.

Referring to FIGS. 9A through 9C, an exemplary embodiment of the light emitting device according to the invention may generate light having improved color purity by respectively resonating lights having different wavelengths. Accordingly, the color reproducibility of the light emitting device may be improved and display characteristics of a display apparatus using the light emitting device as a backlight may be improved.

As described herein, an exemplary embodiment of a light emitting device according to the invention includes a light emitting chip that generates a first light, a first resonator that generates and resonates a second light to emit the second light, and a second resonator that generates and resonates a third light to emit the third light. Accordingly, in such an embodiment, the light emitting device may efficiently generate lights having various wavelengths and may provide uniform white light.

In exemplary embodiments, each of the resonators of the light emitting device includes half mirror layers including or composed of a plurality of inorganic layers. Accordingly, the resonators may be effectively realized by using an inorganic material, which may be used in a typical encapsulation member, without an additional separate configuration, and color reproducibility of the light emitting device may be improved by reducing the FWHM of the reflection spectrum.

While some exemplary embodiments of the invention has been particularly shown and described with reference to the accompanying drawings, it will be understood by those of ordinary skill in the art that various changes in form and details may be made therein without departing from the spirit and scope of the invention as defined by the following claims. Accordingly, it is to be understood that the invention is not to be limited by the disclosed embodiments, but only by the scope of the appended claims.

What is claimed is:

1. A light emitting device comprising:
a light emitting chip which generates a first light having a first color;
a first cavity layer disposed on the light emitting chip and having a first refractive index, wherein the first cavity layer generates a second light having a second color different from the first color;
a second cavity layer disposed on the first cavity layer and having a second refractive index different from the first refractive index, wherein the second cavity layer generates a third light having a third color different from the first color and the second color;
a first half mirror layer disposed between the first cavity layer and the light emitting chip, wherein the first half mirror layer reflects at least a portion of the second light;
a second half mirror layer disposed between the first cavity layer and the second cavity layer, wherein the second half mirror layer reflects at least a portion of the third light; and
a third half mirror layer disposed on the second cavity layer, wherein the third half mirror layer transmits the first light,
wherein
the first cavity layer resonates the second light, and
the second cavity layer resonates the third light.

2. The light emitting device of claim 1, wherein
a product of a thickness of the first cavity layer and the first refractive index is i times a full width at half maximum of the second light, and
a product of a thickness of the second cavity layer and the second refractive index is j times a full width at half maximum of the third light,
wherein i and j are natural numbers equal to or greater than 1.

3. The light emitting device of claim 2, wherein i and j are equal to or less than 6.

4. The light emitting device of claim 3, wherein the thickness of the first cavity layer and the thickness of the second cavity layer are in a range of about 0.1 micrometer to about 1.0 micrometer.

5. The light emitting device of claim 3, wherein the first cavity layer comprises:
a first base part disposed between the first half mirror layer and the second half mirror layer, and having the first refractive index; and
a first phosphor dispersed in the first base part, where the first phosphor generates the second light by absorbing at least a portion of the first light.

6. The light emitting device of claim 5, wherein the second cavity layer comprises:
a second base part disposed between the second half mirror layer and the third half mirror layer, and having the second refractive index; and
a second phosphor dispersed in the second base part, wherein the second phosphor generates the third light by absorbing at least a portion among the first light and the second light.

7. The light emitting device of claim 6, wherein
the first phosphor is a green phosphor, and
the second phosphor is a red phosphor.

8. The light emitting device of claim 6, wherein the first phosphor is a quantum dot having a smaller size than the second phosphor.

9. The light emitting device of claim 1, wherein each of the first to third half mirror layers comprises a plurality of inorganic layers which are alternately stacked one on another and have different refractive indices from each other.

10. The light emitting device of claim 9, wherein
the first half mirror layer comprises the inorganic layers in which a product of a refractive index and a thickness of each inorganic layer is about ¼ of a wavelength of the second light, and
the second half mirror layer comprises the inorganic layers in which a product of a refractive index and a thickness of each inorganic layer is about ¼ of a wavelength of the third light.

11. The light emitting device of claim 10, wherein the wavelength of the second light is in a range of about 480 nanometers or about 560 nanometers.

12. The light emitting device of claim 10, wherein the wavelength of the third light is in a range of about 640 nanometers to about 780 nanometers.

13. The light emitting device of claim 10, wherein a ratio between the refractive indices of the two inorganic layers disposed adjacent to each other among the plurality of inorganic layers is equal to or less than about 0.7.

14. The light emitting device of claim 13, wherein the plurality of inorganic layers comprises at least one of silicon oxide, titanium oxide, silicon nitride, hafnium oxide and zirconium oxide.

15. The light emitting device of claim 14, wherein a thickness of each of the first to third half mirror layers is in a range of about 0.6 micrometer to about 10 micrometers.

16. The light emitting device of claim 1, further comprising:
a body member, in which an inner space is defined, wherein the light emitting chip is disposed on a surface of the body member defining the inner space to expose the light emitting chip;
a first lead fixed to the body member and connected to the light emitting chip; and
a second lead fixed to the body member, insulated from the first lead, and connected to the light emitting chip,
wherein the first to third half mirror layers and the first and second cavity layers are disposed in the inner space.

17. A light emitting device comprising:
a light emitting chip which generates a first light having a first color;
a first resonator disposed on the light emitting chip, wherein the first resonator comprises:
a first half mirror layer;
a second half mirror layer disposed on the first half mirror layer; and
a first cavity layer having a first refractive index, the first cavity layer is disposed between the first half mirror layer and the second half mirror layer and generates a second light having a second color different from the first color, wherein the first resonator resonates the second light; and
a second resonator disposed on the first resonator, wherein the second resonator comprises:
a third half mirror layer;
a fourth half mirror layer disposed on the third half mirror layer; and
a second cavity layer having a second refractive index different from the first refractive index, the second cavity layer is disposed between the third half mirror layer and the fourth half mirror layer and generates a third light having a third color different from the first color and the second color, wherein the second resonator resonates the third light,
wherein each of the first to fourth half mirror layers comprises a plurality of inorganic layers which are alternately stacked one on another and have different refractive indices from each other.

18. The light emitting device of claim 17, wherein the second half mirror layer and the third half mirror layer are in contact with each other.

19. The light emitting device of claim 18, further comprising:
a body member, in which an inner space is defined, wherein the light emitting chip is disposed on a surface of the body member defining the inner space to expose the light emitting chip,
wherein the first resonator and the second resonator are disposed in the inner space.

20. The light emitting device of claim 19, further comprising:
an encapsulation member disposed in the inner space and filled between the first resonator and the light emitting chip,
wherein the encapsulation member encapsulates the light emitting chip and diffuses the first light.

* * * * *